US011835752B2

(12) United States Patent
Leung et al.

(10) Patent No.: US 11,835,752 B2
(45) Date of Patent: *Dec. 5, 2023

(54) BROAD SPECTRUM RADIATION BY SUPERCONTINUUM GENERATION USING A TAPERED OPTICAL FIBER

(71) Applicant: ASML HOLDING N.V., Veldhoven (NL)

(72) Inventors: King Pui Leung, Fort Lee, NJ (US); Tao Chen, New York, NY (US); Ronan James Havelin, Norwalk, CT (US); Igor Matheus Petronella AARTS, Port Chester, NY (US); Adel Joobeur, Milford, CT (US); Joseph Carbone, Southport, CT (US)

(73) Assignee: ASML HOLDING N.V., Veldhoven (NL)

( * ) Notice: Subject to any disclaimer, the term of this patent is extended or adjusted under 35 U.S.C. 154(b) by 335 days.

This patent is subject to a terminal disclaimer.

(21) Appl. No.: 17/066,524

(22) Filed: Oct. 9, 2020

(65) Prior Publication Data

US 2021/0033779 A1     Feb. 4, 2021

Related U.S. Application Data

(63) Continuation of application No. 16/094,244, filed as application No. PCT/EP2017/056338 on Mar. 17, 2017, now Pat. No. 10,802,208.
(Continued)

(51) Int. Cl.
*G02B 6/02*     (2006.01)
*G02F 1/365*     (2006.01)
(Continued)

(52) U.S. Cl.
CPC .......... *G02B 6/02004* (2013.01); *G01B 11/02* (2013.01); *G02B 6/1228* (2013.01);
(Continued)

(58) Field of Classification Search
CPC ............ G02B 6/02004; G02B 6/02295; G02B 6/1228; G02B 6/262; G02B 6/2746;
(Continued)

(56) References Cited

U.S. PATENT DOCUMENTS

| 6,181,463 | B1 | 1/2001 | Galvanauskas |
| 10,670,978 | B2 * | 6/2020 | Leung ................. G03F 7/70633 |

(Continued)

FOREIGN PATENT DOCUMENTS

| CN | 1527139 | 9/2004 |
| CN | 1892439 | 1/2007 |

(Continued)

OTHER PUBLICATIONS

International Search Report and Written Opinion issued in corresponding PCT Patent Application No. PCT/EP2017/056338, dated Jul. 7, 2017.
(Continued)

*Primary Examiner* — Michael P Mooney
(74) *Attorney, Agent, or Firm* — Pillsbury Winthrop Shaw Pittman, LLP

(57) ABSTRACT

A measurement apparatus, including: a tapered optical fiber, the tapered optical fiber having an input to receive radiation and having an output to provide spectrally broadened output radiation toward a measurement target, the tapered optical fiber configured to spectrally broaden the radiation received at the input; and a detector system configured to receive a redirected portion of the output radiation from the measurement target.

20 Claims, 4 Drawing Sheets

Related U.S. Application Data

(60) Provisional application No. 62/324,785, filed on Apr. 19, 2016.

(51) Int. Cl.

| | | |
|---|---|---|
| *G01B 11/02* | (2006.01) | |
| *G02B 6/122* | (2006.01) | |
| *G02B 6/293* | (2006.01) | |
| *G03F 9/00* | (2006.01) | |
| *G02B 6/27* | (2006.01) | |
| *G02F 1/35* | (2006.01) | |

(52) U.S. Cl.
CPC ....... *G02B 6/2746* (2013.01); *G02B 6/29377* (2013.01); *G02F 1/365* (2013.01); *G03F 9/7065* (2013.01); *G01B 2210/56* (2013.01); *G02F 1/3528* (2021.01)

(58) Field of Classification Search
CPC ...... G02B 6/293; G02B 6/29377; G02B 6/32; G02B 6/4225; G01B 11/02; G03F 9/7065
See application file for complete search history.

(56) References Cited

U.S. PATENT DOCUMENTS

| | | | |
|---|---|---|---|
| 10,802,208 B2 * | 10/2020 | Leung | G02B 6/2746 |
| 2004/0028356 A1 | 2/2004 | Birks et al. | |
| 2004/0057682 A1 | 3/2004 | Nicholson et al. | |
| 2004/0105637 A1 | 6/2004 | Goto et al. | |
| 2005/0094941 A1 | 5/2005 | Knox | |
| 2005/0110965 A1 | 5/2005 | Hendriks et al. | |
| 2006/0066855 A1 | 3/2006 | Boef et al. | |
| 2006/0198588 A1 | 9/2006 | Kuksenkov | |
| 2007/0002336 A1 | 1/2007 | Pellemans et al. | |
| 2010/0016732 A1 | 1/2010 | Wells | |
| 2013/0308142 A1 | 11/2013 | Straaijer | |
| 2017/0277046 A1 | 9/2017 | Leung et al. | |

FOREIGN PATENT DOCUMENTS

| | | |
|---|---|---|
| CN | 104541198 | 4/2015 |
| EP | 1739493 | 1/2007 |
| EP | 2690724 A2 | 1/2014 |
| EP | 2690724 A3 | 11/2016 |
| JP | 2002082286 | 3/2002 |
| JP | 2004343057 | 12/2004 |
| JP | 2007010666 | 1/2007 |
| JP | 2008262004 | 10/2008 |
| JP | 2009222908 | 10/2009 |
| KR | 20040081014 | 9/2004 |
| TW | 201610542 | 3/2016 |
| WO | 2015003714 | 1/2015 |
| WO | 2016030177 | 3/2016 |

OTHER PUBLICATIONS

Teipel, J, et al.: "Characteristics of supercontinuum generation in tapered fibers using femtosecond laser pulses", Applied Physics B—Lasers and Optics, vol. 77, No. 2-3, 2003, pp. 245-251.
Korean Office Action issued in corresponding Korean Patent Application No. 10-2018-7032238, dated Sep. 5, 2019.
Japanese Office Action issued in corresponding Japanese Patent Application No. 2018-553464, dated Nov. 6, 2019.
Wang, Zhaoyang et al.: "Supercontinuum Spectrum Generation in Tapered Fiber Using Femtosecond Laser Pulses", Memoirs of the Muroran Institute of Technology, Nov. 2006, No. 56, pp. 1-7.
Birks et al., "Supercontinuum generation in tapered fibers", Optics Letters, vol. 25, Issue 19, pp. 1415-1417 (2000).
Japanese Office Action issued in corresponding Japanese Patent Application No. 2018-553464, dated Feb. 28, 2020.
Chinese Office Action issued in corresponding Chinese Patent Application No. 201780034762.5, dated Jun. 1, 2020.

* cited by examiner

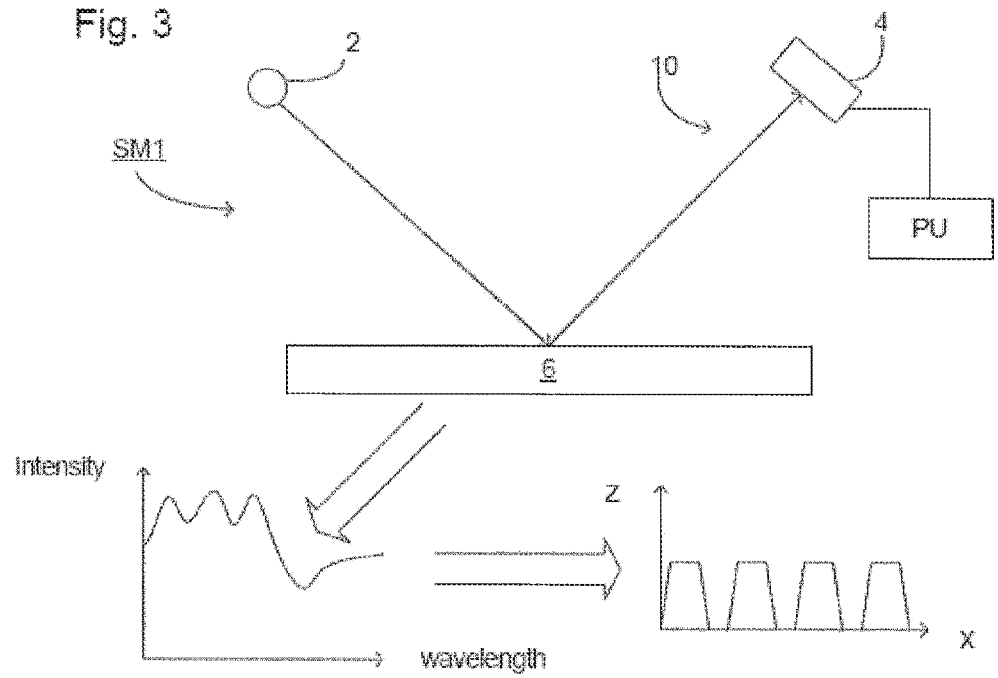
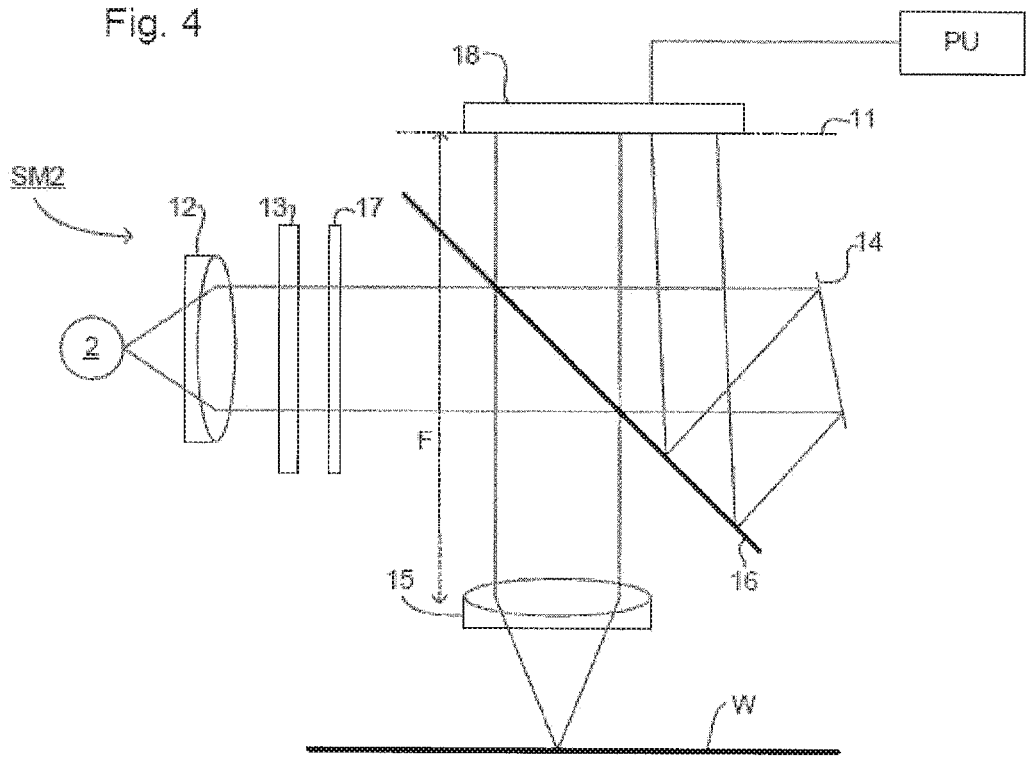

BROAD SPECTRUM RADIATION BY SUPERCONTINUUM GENERATION USING A TAPERED OPTICAL FIBER

This application is a continuation of U.S. patent application Ser. No. 16/094,244, which was filed on Oct. 17, 2018, now allowed, which is the U.S. national phase entry of PCT/EP2017/056338, which was filed on Mar. 17, 2017, which claims the benefit of priority of U.S. Provisional Patent Application No. 62/324,785, which was filed on Apr. 19, 2016, each of the foregoing applications is incorporated herein in its entirety by reference.

FIELD

The present description relates to a method and apparatus of providing a spectrally broadened radiation using a tapered optical fiber.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable to make measurements using an optical measuring technique. For example, with the aid of a lithographic apparatus, different patterns are successively imaged at a precisely aligned position onto the substrate. The substrate may undergo physical and chemical changes between the successive images that have been aligned with each other. The substrate is removed from the apparatus after it has been exposed with the image of at least one pattern, and, after it has undergone the desired process steps, the substrate is placed back in order to expose it with an image of a further pattern, and so forth, while it must be ensured that the images of the further pattern and any subsequent patterns are positioned accurately with respect to the at least one already exposed image on the substrate. To this end, the substrate is provided with one or more alignment targets (e.g., alignment marks) to provide a reference location on the substrate, and the lithographic apparatus is provided with an alignment system to measure the alignment position of the one or more alignment targets. By measuring the alignment position of the one or more alignment targets, in principle the position of a point on the substrate can be predicted, e.g., the location of a previously exposed target portion can be calculated and the lithographic apparatus can be controlled to expose a successive target portion on top of the previously exposed target portion.

Usually, an alignment target on the substrate comprises one or more diffraction structures such as diffraction gratings. The alignment system then comprises an alignment sensor system with a radiation source to emit radiation towards the one or more grating and a detector to detect a redirected portion (e.g., diffracted radiation) of the incident radiation, e.g., diffracted in first, second, third and/or higher order radiation, which is used to determine the position of the one or more gratings.

Further, it is desirable to make measurements of the structures created (e.g., the device features in resist and/or other layer on or of the substrate), e.g., for process control and verification. One or more parameters of the structures are typically measured or determined, for example the overlay error between successive layers formed in or on the substrate. There are various techniques for making measurements of the microscopic structures formed in a lithographic process. Various tools for making such measurements are known, including scanning electron microscopes, which are often used to measure critical dimension (CD), and specialized tools to measure overlay, the accuracy of alignment of two layers in a device. An example of such a tool is a scatterometer developed for use in the lithographic field. This device directs a beam of radiation onto a target on the surface of the substrate and measures one or more properties of the redirected radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods, library searches, and principal component analysis. Like with alignment, the target may be a diffraction grating, e.g., typically a compound grating of a grating in one layer overlaid by another grating in another layer.

SUMMARY

Many optical measurement systems (e.g., lithography alignment and/or overlay sensors) benefit from bright spatially coherent radiation that has a broad spectral width and short coherence length for precise alignment. Further, it is desirable, for example, that the radiation has multiple colors/wavelengths spanning across most, if not the entire, visible spectrum and encompassing up to the near-infrared at about ~900 nm or beyond. However, such bright radiation may be difficult to obtain. For example, a high power radiation source, such as a light emitting diode (LED), has a short coherence length due to its broad spectral width. However, it can lack adequate spectral radiance brightness. On the other hand, a laser, such as a laser diode, is inherently bright but has a long coherence length which can introduce, for example, undesirable coherence effects in an optical sensor. Efforts made to reduce a laser's coherence length by broadening the spectral width with various hi-speed modulation techniques tend to make the radiation source system complex and unreliable.

Thus, many existing broad spectrum radiation sources with short coherence length, high spectral intensity, and spatial coherence in the visible and/or near infrared region used for optical measurement are complex in design and have reliability and performance issues/problems. Thus, it is desirable, for example, to provide a relatively simple and straight forward approach of providing broad spectrum radiation for an optical measurement system with the potential for good performance, good reliability and/or lower cost.

Therefore, it is desirable, for example, to provide an optical measurement apparatus that outputs a bright spectrum with a broad spectral width, for example, in the wavelength region of between 500 nm and 900 nm. Furthermore, although not limited to this, it would be advantageous that the radiation source is reliable and compact, and has a bright spectral radiance.

In an embodiment, there is provided a measurement apparatus, comprising: a tapered optical fiber, the tapered optical fiber having an input to receive radiation and having an output to provide spectrally broadened output radiation toward a measurement target, the tapered optical fiber configured to spectrally broaden the radiation received at the input; and a detector system configured to receive a redirected portion of the output radiation from the measurement target.

In an embodiment, there is provided a method, comprising: spectrally broadening, using a tapered optical fiber, received radiation to generate an output radiation; providing the output radiation onto a measurement target; and receiving a redirected portion of the output radiation from the measurement target at a detector system.

BRIEF DESCRIPTION OF THE DRAWINGS

Embodiments will now be described, by way of example only, with reference to the accompanying drawings in which:

FIG. 3 schematically depicts an embodiment of a measurement apparatus;

FIG. 4 schematically depicts a further embodiment of a measurement apparatus;

DETAILED DESCRIPTION

Before describing embodiments in detail, it is instructive to present an example environment in which embodiments may be implemented.

Figure 1:
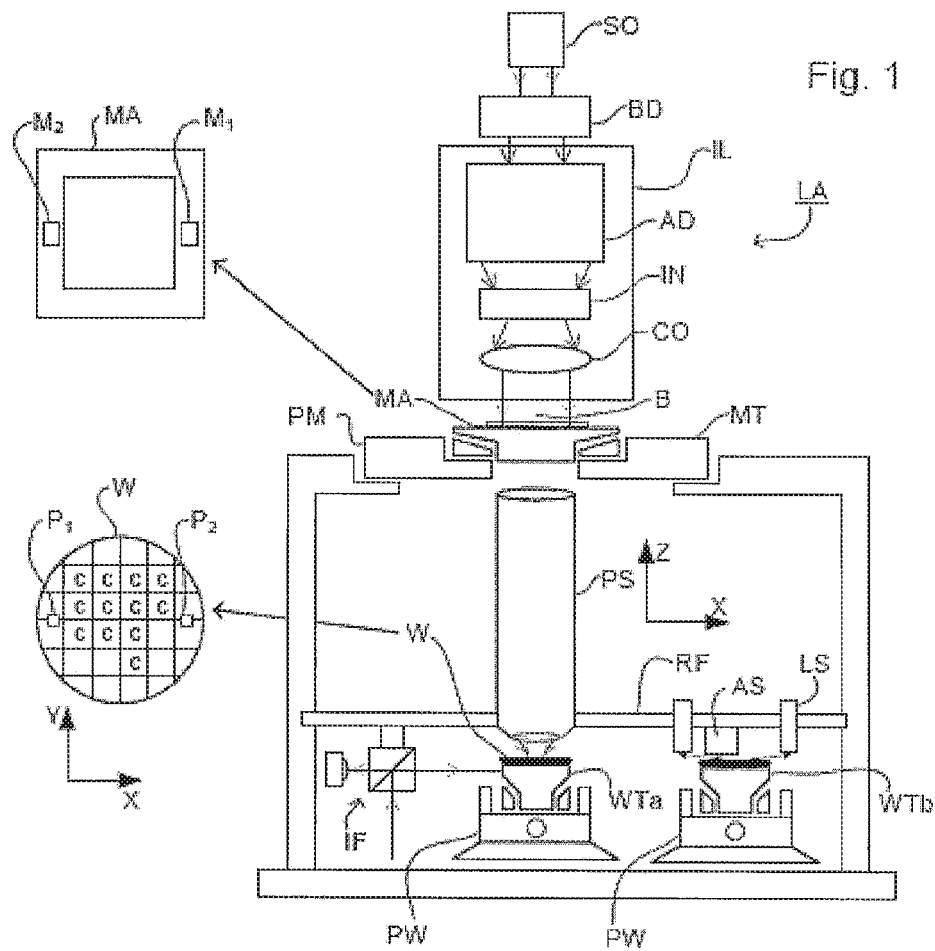
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using patterning device alignment targets M1, M2 and substrate alignment targets P1, P2. Although the substrate alignment targets as illustrated occupy dedicated target portions, they may be located in spaces between target portions (these are known as scribe-lane alignment targets). Similarly, in situations in which more than one die is provided on the patterning device (e.g., mask) MA, the patterning device alignment targets may be located between the dies. Small alignment targets may also be included within dies, in amongst the device features, in which case it is desirable that the markers be as small as possible and not require any different imaging or process conditions than adjacent features. The alignment system, which detects the alignment targets, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment targets on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
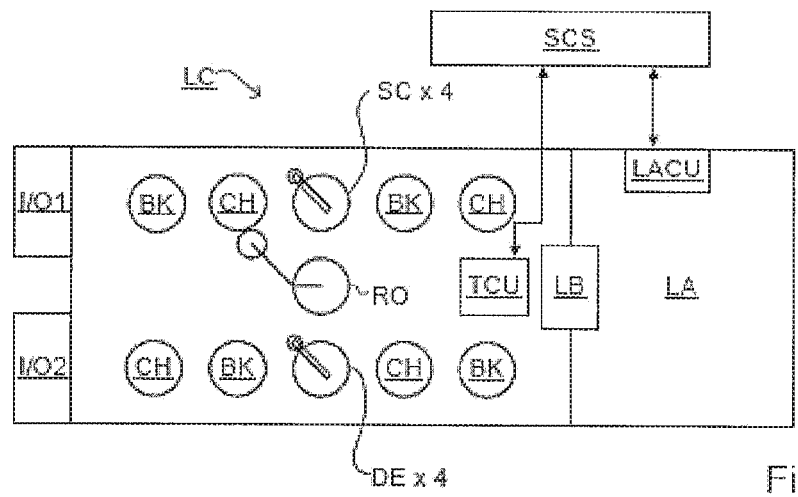
FIG. 2 schematically depicts an embodiment of a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

As described above, a substrate (and/or a substrate table and/or the patterning device) may be provided with one or more alignment targets to provide a reference location on the substrate, and the lithographic apparatus is provided with an alignment system to measure the alignment position of the one or more alignment targets. By measuring the alignment position of the one or more alignment targets, in principle the position of one or more points on the substrate can be predicted, e.g., the location of a previously exposed target portion can be calculated and the lithographic apparatus can be controlled to expose a successive target portion on top of the previously exposed target portion.

Usually, an alignment target on the substrate comprises one or more diffraction gratings. The alignment system of the lithographic apparatus then comprises an alignment sensor system with a radiation source to emit radiation towards the one or more gratings and a detector to detect diffracted radiation from the one or more grating, e.g., radiation diffracted in a first, second, third and/or higher order, which is used in order to determine the position of the one or more gratings.

Additionally or alternatively, in order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

FIG. 3 depicts an embodiment of a measurement apparatus SM1. It comprises a radiation projector 2 (e.g. broadband (white light) radiation projector) which projects radiation onto a target (e.g., a diffracting grating) of a substrate 6. The reflected radiation is passed to a detector 4 (e.g., spectrometer detector), which, in this case, measures a spectrum 10 (i.e. a measurement of intensity as a function of wavelength) of the specular radiation. From this data, the structure or profile giving rise to the detected spectrum may be, e.g., reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another embodiment of a measurement apparatus SM2 is shown in FIG. 4. In this device, the radiation emitted by radiation source 2 is focused using lens system 12 through interference filter 13 and polarizer 17, reflected by partially reflective surface 16 and is focused onto a target of substrate W via an objective lens 15, which has a high numerical aperture (NA), desirably at least 0.9 or at least 0.95. An immersion measurement (using liquid between the lens 15 and the substrate W) may even have a lens with a numerical aperture over 1. The reflected radiation then transmits through partially reflective surface 16 into a detector 18 in order to have the scattered radiation detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is, for example, a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

By comparing one or more properties of the beam before and after it has been redirected by the target, one or more properties of the substrate may be determined. This may be done, for example, by comparing the redirected beam with theoretical redirected beams calculated using a model of the substrate and searching for the model that gives the best fit between measured and calculated redirected beams. Typically a parameterized generic model is used and the parameters of the model, for example width, height and sidewall angle of the pattern, are varied until the best match is obtained.

Two main types of scatterometer are used. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity (or intensity ratio and phase difference in case of an ellipsometric configuration) of the scattered radiation as a function of angle. Alternatively, measurement signals of different wavelengths may be measured separately and combined at an analysis stage. Polarized radiation may be used to generate more than one spectrum from the same substrate.

In order to determine one or more parameters of the substrate, a best match is typically found between the theoretical spectrum produced from a model of the substrate and the measured spectrum produced by the redirected beam as a function of either wavelength (spectroscopic scatterometer) or angle (angularly resolved scatterometer). To find the best match there are various methods, which may be combined. For example, a first method is an iterative search method, where a first set of model parameters is used to calculate a first spectrum, a comparison being made with the measured spectrum. Then a second set of model parameters is selected, a second spectrum is calculated and a comparison of the second spectrum is made with the measured spectrum. These steps are repeated with the goal of finding the set of parameters that gives the best matching spectrum. Typically, the information from the comparison is used to steer the selection of the subsequent set of parameters. This process is known as an iterative search technique. The model with the set of parameters that gives the best match is considered to be the best description of the measured substrate.

A second method is to make a library of spectra, each spectrum corresponding to a specific set of model parameters. Typically the sets of model parameters are chosen to cover all or almost all possible variations of substrate properties. The measured spectrum is compared to the spectra in the library. Similarly to the iterative search method, the model with the set of parameters corresponding to the spectrum that gives the best match is considered to be the best description of the measured substrate. Interpolation techniques may be used to determine more accurately the best set of parameters in this library search technique.

In any method, sufficient data points (wavelengths and/or angles) in the calculated spectrum should be used in order to enable an accurate match, typically between 80 up to 800 data points or more for each spectrum. Using an iterative method, each iteration for each parameter value would involve calculation at 80 or more data points. This is multiplied by the number of iterations needed to obtain the correct profile parameters. Thus many calculations may be required. In practice this leads to a compromise between accuracy and speed of processing. In the library approach, there is a similar compromise between accuracy and the time required to set up the library.

In another measurement embodiment, the radiation can be detected and a difference in measured intensity of first order radiation is correlated to a parameter of interest, e.g., overlay, from a measurement target (e.g., comprising a grating overlying another grating in a different layer on the substrate).

In any of the measurement apparatus described above, the target on substrate W may be a grating which is printed such that after development, the features are formed of solid resist lines. The features may alternatively be etched into the substrate.

In an embodiment, the target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes.

While embodiments of a scatterometer have been described herein, other types of metrology apparatus may be used in an embodiment. For example, a dark field metrology apparatus such as described in U.S. Patent Application Publication No. 2013-0308142, which is incorporated herein in its entirety by reference, may be used. Further, those other types of metrology apparatus may use a completely different technique than scatterometry.

And, while examples of an inspection apparatus have been described (mostly operating on scatterometry principles), an alignment apparatus operates on similar principles of providing radiation from a source onto a target (e.g., an alignment grating), detecting a redirected portion (e.g., diffracted) of the radiation from the target using a detector, and analyzing the detected radiation to determine alignment between two or more objects (e.g., a substrate and a patterning device).

Figure 5:
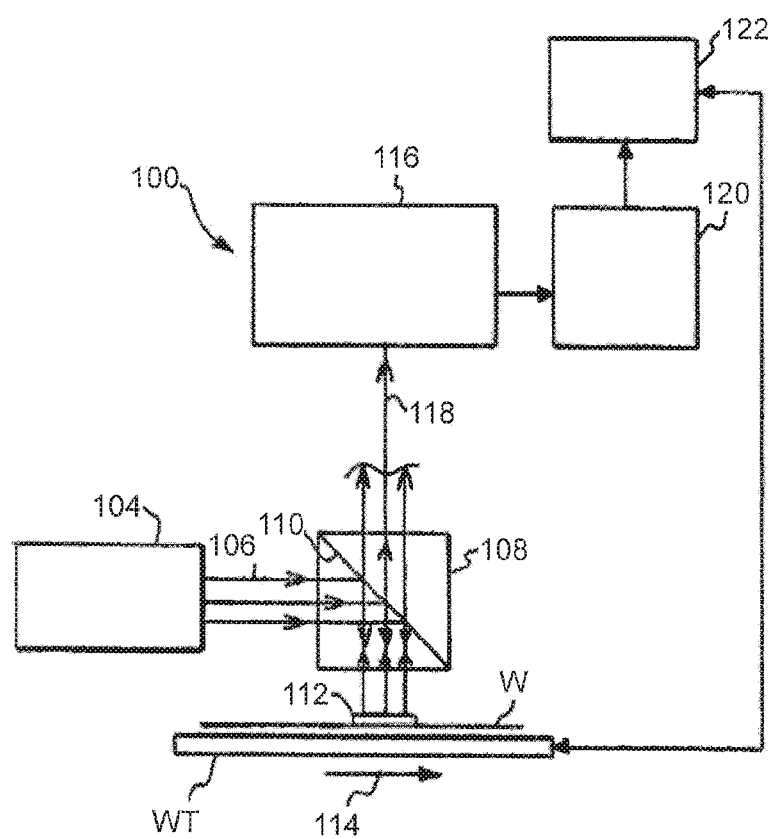
FIG. 5 schematically depicts an alignment sensor apparatus.

FIG. 5 is a schematic diagram illustrating an example alignment system 100. The alignment system 100 comprises a coherent illumination source 104, such as a laser, providing electromagnetic radiation 106, to a prism 108. At least a portion of the electromagnetic radiation is reflected off interface 110 to illuminate an alignment target 112 (e.g., an alignment mark), which may be located on a substrate W, on a substrate table WT, etc. The alignment target 112 may have one hundred and eighty degree symmetry. By one hundred and eighty degree symmetry, it is meant that when the alignment target 112 is rotated one hundred and eighty degrees about an axis of symmetry perpendicular to the plane of the alignment target 112, the alignment target is substantially identical to the unrotated alignment target. The axis for which this is true is called the axis of symmetry. In an embodiment, the alignment target 112 is located in a radiation-sensitive film on the substrate W.

In an embodiment, relative motion is provided between the alignment target 112 and the radiation beam in the direction indicated by arrow 114 (by, e.g., moving substrate table WT). Electromagnetic radiation redirected by the alignment target 112 passes through the prism 108 and is collected by an image rotation interferometer 116. It should be appreciated that a good quality image need not be formed, but that the features of the alignment target should be resolved. The image rotation interferometer 116 may be any appropriate set of optical elements, and is, in an embodiment, a combination of prisms, that form two images of the alignment target, rotates one of the images with respect to the other one hundred and eighty degrees and then recombines the two images interferometrically so that when aligned with the alignment target 112, the electromagnetic radiation will interfere either in a polarization sense or in an amplitude sense, constructively or destructively, making readily detectable the center of the alignment target 112. The optical ray passing through the center of rotation established by the interferometer, 116, defines the sensor alignment axis 118.

A detector 120 receives the electromagnetic radiation from the image rotation interferometer 116. The detector 120 then provides one or more signals to the signal analyzer 122. The signal analyzer 122 is coupled to the substrate table WT or its position sensor IF such that the position of the substrate table WT is known when the center of the alignment target 112 is determined. Therefore, the position of the alignment target 112 is accurately known with reference to the substrate table WT. Alternatively, the location of the alignment sensor 100 may be known such that the center of the alignment target 112 is known with reference to the alignment sensor 100. Accordingly, the exact location of the center of the alignment target 112 is known relative to a reference position.

In an embodiment, the illumination source 104 comprises a 4-color laser module assembly (LMA) and a polarized multiplexer (PMUX). The LMA is configured to generate four distinct laser beams. For example, LMA 30 may generate a 532 nm green wavelength beam of radiation, a 633 nm red wavelength beam of radiation, a 780 nm near infrared wavelength beam of radiation and an 850 nm far infrared wavelength beam of radiation. The polarized multiplexer is configured to multiplex the four laser beams generated by the LMA into a single polarized beam that serves as the illumination source for alignment system 100.

A radiation source with high brightness is desirable for various processes in lithography such as measuring the alignment of a patterning device and/or substrate, scatterometry, etc. It may also be desirable for the radiation source to have a wide spectral width around a nominal wavelength and which spectral width is adjustable and stable. Further, it may be desirable for the radiation source to have different bandwidths. Further, it may desirable for the radiation source to provide various different colors depending on the target feature size, thin film chemistry (e.g., photoresist, antireflection coating, etc.), one or more thin film optical characteristic (e.g., refractive index, transmittance, etc.), and/or one or more thin film stack characteristics (e.g., thickness) used in the lithography process. Additionally, it is desirable for the radiation source to have a short coherence length so as to, for example, reduce the coherence interference effects from spurious or ghost reflections.

According to an embodiment, there is provided a radiation source with a relatively broad spectral width around a nominal wavelength. According to an embodiment, the radiation source is provided by coupling a laser outputting radiation (continuous wave and/or pulsed in a form of a periodic optical pulse train) to an input end of a tapered optical fiber and spectrally broadening the radiation in the tapered optical fiber such that an output radiation at an output end of the tapered optical fiber has a spectral width selected from between 500 nm and 900 nm (or beyond), e.g., a spectral width encompassing the 500 nm to 900 nm spectral region.

To achieve such spectral width, a parameter of the laser and/or a parameter of the tapered optical fiber may be modulated. For example, a parameter of the laser, such as wavelength, average power, peak power, pulse width, pulse separation, pulse repetition rate, or any combination selected therefrom, may be adjusted to provide the spectral width of the output radiation. As an example, a parameter of the tapered optical fiber can be modulated such as the width (e.g., diameter) of the taper waist to control the dispersion of the fiber so as to put the laser wavelength(s) used into the anomalous dispersion of the fiber there and to facilitate soliton based spectral broadening of the laser radiation. That is, the group velocity dispersion (GVD) can be made anomalous at a visible or near infrared wavelength with appropriate taper waist cross-sectional size (e.g., diameter or width). Additionally or alternatively, one or more dimensions of an un-tapered section and/or a transition section (between the un-tapered section and the taper waist) of the fiber, such as core and/or cladding cross-sectional size (e.g., diameter) and/or length, can be adjusted to improve and/or maximize the performance of the system, such as the system's transmission the spectral width generated, and/or the spatial mode quality of the output beam.

In an embodiment, the radiation source is provided by coupling two or more lasers to the input end of the tapered optical fiber. Each of the two or more lasers provides continuous or pulsed radiation. In an embodiment, the two or more lasers each have a wavelength within the 500 nm to 900 nm spectral range and are used to generate the broad spectrum radiation within 500 nm to 900 nm (or beyond) spectral region. The use of more than one laser can improve the output power of the system and/or provide redundancy in terms of lasers. In an embodiment, multiple lasers with wavelengths within the spectral response of the detector system can be used simultaneously to achieve the power, spectral width, and/or reliability needed for the detector. In an embodiment, the laser outputs are combined for the tapered fiber with a dichroic or polarization combiner depending on the wavelengths and/or polarizations of the lasers used. In some examples, the two or more lasers may have different polarizations and are combined with a polarization combiner. In some examples, the two or more lasers may have different nominal wavelengths combined with at least one dichroic mirror.

Figure 6:
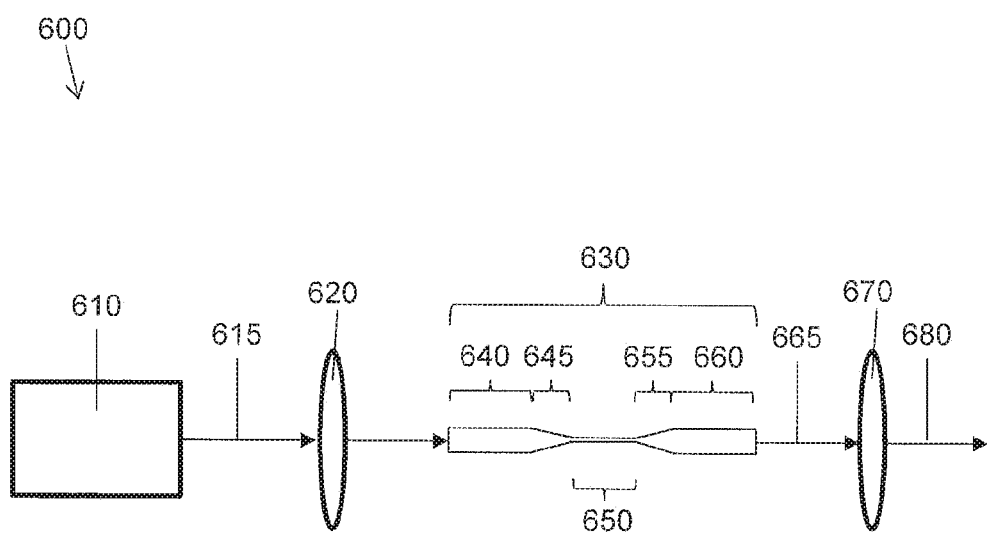
FIG. 6 schematically depicts an embodiment of a short coherence length radiation system with a spectral width between about 500 nm and about 900 nm.

FIG. 6 schematically depicts an embodiment of a short coherence length radiation system with a spectral width selected from between 500 nm and 900 nm, e.g., encompassing the 500 nm to 900 nm spectral region. System 600 includes a radiation source 610 providing input radiation 615 (e.g., in a form of a period pulse train) to a tapered optical fiber 630 via one or more optical elements 620. In an embodiment, the input radiation 615 is provided in free space. In an embodiment, the radiation source 610 includes a laser outputting radiation one or more wavelengths selected from between 500 nm and 900 nm (e.g., Ti-sapphire laser, Alexandrite laser, ruby laser, praseodymium-based laser, frequency doubled infrared laser such as a Nd:YAG or Er:Yd laser, a visible or near infrared NIR laser diode, etc.). In an embodiment, the radiation source 610 includes a free space pulsed laser (e.g., a Ti-sapphire pulsed laser) operating at a nominal wavelength of about 780 nm. In an embodiment, the radiation source 610 includes two or more lasers (e.g., two or more of the following, or a combination of two or more selected from: Ti-sapphire laser, Alexandrite laser, ruby laser, praseodymium-based laser, frequency doubled infrared laser such as a Nd:YAG or Er:Yd laser, a visible or near infrared NIR laser diode) with different polarizations combined with a free space polarization combiner. In an embodiment, the radiation source 610 includes two or more lasers (e.g., two or more of the following, or a combination of two or more selected from: Ti-sapphire laser, Alexandrite laser, ruby laser, praseodymium-based laser, frequency doubled infrared laser such as a Nd:YAG or Er:Yd laser, a visible or near infrared NIR laser diode) with different wavelengths combined with at least one dichroic mirror. In an embodiment, in this case, the one or more optical elements 620 include, for example, a collimator and/or a coupling lens. In an embodiment, the input radiation 615 is provided in an optical fiber. In an embodiment, the radiation source 610 includes a fiber laser (e.g., a frequency-doubled erbium fiber laser) operating at a nominal wavelength of about 780 nm. In an embodiment, the radiation source 610 includes two or more fiber lasers (e.g., frequency-doubled erbium fiber lasers) with different polarizations combined by at least one fiber-based polarization beam combiner. In an embodiment, the radiation source 610 includes two or more fiber lasers (e.g., frequency-doubled erbium fiber lasers) with different wavelengths combined with a multiplexing module or at least one fiber coupler. In an embodiment, in this case, the one or more optical elements 620 may include, for example, an optical connector.

Output radiation 665 is obtained at the output of the tapered optical fiber 630. The output radiation 665 is then provided to output optics 670 which may include, for example, a collimator, a lens, a prism, a grating, an etalon, a spectral filter, or other optical element. In an embodiment, wavelength sensitive optics, such as a spectral filter, an etalon, or a spectrally dispersive optic such as a prism or a grating coupled with spatial filtering, with the pass-band wavelength(s) located within the spectrum of the output radiation can be placed after the fiber to select and/or control the wavelength and spectral width of the spectrally broadened radiation for use downstream. Thus, in an embodiment, there is provided a band-pass filter, at or downstream of the output of the tapered optical fiber 630, to reduce and/or control the wavelength and/or spectral width of the output radiation. For example, the spectral width may be larger than desired and the band-pass filter can reduce the spectral width or select a certain spectral width of the output spectral width. In an embodiment, the band-pass filter is adjustable to provide different amounts of filtering and at different wavelengths. As an example of an adjustable filter, there may be provided an exchanger to put into the beam path a selected one of a plurality of filters, each filter specific to a different wavelength or amount of spectral width. The exchanger might be a rotating wheel that rotates different filters into the beam path. The radiation 680 from output optics 670 is then provided to a target on, for example, substrate W for use in optical measurement.

In an embodiment, the nominal wavelength of the input radiation 615 coincides with, or is shorter than, one or more wavelengths (in an embodiment, a plurality of wavelengths) for which the optical sensor is designed. The spectral broadening of a laser with its nominal wavelength at or near that designed one or more wavelengths of the optical sensor provides for a more direct, efficient, and reliable means to generate the wide spectral width radiation for the sensor. In other words, the spectral broadening of a laser with its nominal wavelength at or shorter than the one or more wavelengths needed by the sensor is in general more efficient and stable than that with a longer wavelength due to more dominant and efficient nonlinear optical processes involved.

As described above, the radiation source 610 may include one or more pulsed lasers. Each of the one or more pulsed lasers is characterized by its pulse width, which is the duration of a single pulse of radiation emitted by the laser, and average power, which measures the total energy emitted by the laser per unit time. Additional parameters that may characterize a pulsed laser include, but are not limited to, peak pulse power, pulse separation, or pulse repetition frequency. Various pulsed lasers may have a pulse width as short as a few femtoseconds (fs) or less or as long as 10's of picoseconds (ps). Average laser power may vary from about 1 mW to about 10 W. In addition, the repetition rate of the pulses from the pulse lasers may vary from about 1 kHz to over 100 MHz.

As shown in FIG. 6, the tapered optical fiber 630 comprises a first untapered region 640, a first transition region 645, a tapered region 650, a second transition region 655, and a second untapered region 660. The core cross-sectional sizes (e.g., diameters) of the first untapered region 640 and the second untapered region 660 are up to about 10 μm. The cladding cross-sectional sizes (e.g., diameters) of the first untapered region 640 and the second untapered region 660 are up to about 140 μm. Thus, in an embodiment, the thickness of the cladding on top of the core in the first untapered region 640 and the second untapered region 660 is up to about 65 μm. In an embodiment, the length of the first untapered region 645 is the same as the length of the second untapered region 660. In an embodiment, the length of the first untapered region 645 is different from the length of the second untapered region 660.

The first transition region 645 is configured to couple the first untapered region 640 to the tapered region 650. Similarly, the second transition region 655 is configured to couple the tapered region 650 to the second untapered region 660. In an embodiment, the lengths of both the first transition region 645 and the second transition region 655 are between about 1 cm and about 5 cm. In an embodiment, the length of the first transition region 645 equals to the length of the second transition region 655. In an embodiment, the length of the first transition region 645 is different from the length of the second transition region 655.

The tapered region 650 is where the input radiation 615 is primarily spectrally broadened to output radiation 665. The length of the tapered region 650 is between about 10 cm and about 50 cm. Sometimes, the length of the tapered region 650 is referred to as the critical length of the tapered optical fiber 630. The cross-sectional size (e.g. diameter) of the tapered region 650 is between about 1.0 μm and about 2.5 μm. In an embodiment, the cross-sectional size of the tapered region 650 is smaller than the core cross-sectional sizes of the first untapered region 640 and the second untapered region 660. In an embodiment, the tapered region 650 can be exposed to atmosphere (i.e., without any external material) or can have a material provided around it (e.g., to support the thin tapered region). Where the tapered region 650 has a material around it, then the tapered region 650 can be considered as a core.

In order to achieve sufficiently high spectral broadening, high intensity radiation should be provided in the tapered region 650 of the tapered optical fiber. As discussed above, the core cross-sectional sizes of the first untapered region 640 and the second untapered region 660 are larger than the cross-sectional size of the tapered region 650. This is designed so that the radiation intensities in the first untapered region 640 and the second untapered region 660 are significantly reduced from the radiation intensity in the tapered region 650 because the intensity is inversely proportional to the square of the beam spot cross-sectional size (e.g., diameter). As a result, the risk of optical damage in the input facet and the output facet of the tapered optical fiber 630 is reduced. In an embodiment, the risk of optical damage at the fiber input and/or output facet can be further reduced with an endcap or tapered optical fiber (e.g., where the taper reduces toward the input facet or the taper expands away from the output facet) fused on them. A tapered optical fiber fused to the untapered input end 640 of the tapered fiber 630 used for spectral broadening can also facilitate the coupling of the laser beam to the tapered fiber. Additionally, the untapered region of the tapered optical fiber fused to the input/output end facilitates interfacing with other standard optical fibers and/or upstream/downstream optics.

In an embodiment, the spectral broadening results in a spectral width of greater than 0.5 nm about the nominal wavelength. In an embodiment, the spectral broadening results in a spectral width of greater than 2 nm about the nominal wavelength.

In an embodiment, the spectral width of the output radiation 665 is relatively wide. In an embodiment, the spectral broadening results in a supercontinuum. In an embodiment, the supercontinuum has a spectral width of greater than or equal to about 350 nm, greater than or equal to 400 nm, greater than or equal to 500 nm, or greater than or equal to 900 nm about the nominal wavelength. In an embodiment, the supercontinuum has a spectral width of selected from the range of about 500 nm to 900 nm.

In an embodiment, the spectral width is symmetrical about the nominal wavelength. In an embodiment, the spectral width is asymmetrical about the nominal wavelength. In an embodiment, where the spectral width is asymmetrical, about 5% or less, about 10% or less, about 20% or less, about 30% or less, or about 40% or less of the spectral width is lower than the nominal wavelength.

For pulsed laser radiation or laser radiation with intensity modulation, a nonlinear optical process called self-phase modulation (SPM) can occur in a nonlinear optical medium with a refractive index that varies depending on radiation intensity, namely the optical Kerr effect (i.e., particularly in the tapered region of the tapered optical fiber). The SPM occurring in a tapered region of a tapered optical fiber may be mathematically described by the equation:

$$n = n_0 + n_2 I \quad (1)$$

where n is the intensity-varying refractive index in the tapered region of the tapered optical fiber, $n_0$ is the nominal refractive index of the tapered optical fiber, $n_2$ is the electro-optic coefficient in the tapered region of the optical fiber and I is the intensity in the tapered region. The electro-optic coefficient is specific to the material of the fiber. For example, silica has an electro-optic coefficient of about $3.2 \times 10^{-20}$ m$^2$/W. The phase change $\Delta\varnothing$ over a fiber length L with a wavelength frequency k is then:

$$\Delta\varnothing(t) \approx dn \cdot k \cdot L = n_2 I(t) k \cdot L \quad (2)$$

and the resultant frequency broadening $\Delta v(t)$ is:

$$\Delta v(t) \approx -\frac{d(\Delta\varnothing(t))}{dt} = -n_2 L \frac{1}{\lambda} \frac{dI(t)}{dt} \quad (3)$$

where λ is the wavelength of the input laser radiation.

Thus, generally, the amount of spectral broadening is proportional to the critical length L of the tapered optical fiber (i.e., the length of the tapered region 650 of the tapered optical fiber 630) and is, for example, larger for shorter pulses with given pulse energy, where the rate of intensity change in time is faster. Thus, different bandwidths and powers of the spectrally broadened radiation generated in the system can be achieved by changing the power of the laser, the pulse width of the laser, the cross-sectional size of the tapered region of the tapered optical fiber and/or the critical length of the tapered optical fiber (i.e., the length of the tapered region). The spectral width of the output radiation can be increased with higher input pump power and/or longer length of the tapered region L of the tapered optical fiber. To be sure, while the proportionalities in the above equations should generally hold for supercontinuum spectral broadening, the actual results from the above equations may not yield accurate results for supercontinuum spectral broadening due to the non-linearity in the soliton-based nonlinear optical processes generated by a nominal laser wavelength(s) in the anomalous dispersion region of the tapered fiber controlled, for example, by the dimensions of the taper waist. In general, the anomalous dispersion region of the tapered fiber 650 will shift to shorter wavelengths with decreasing tapered fiber waist cross-sectional size (e.g., diameter).

At sufficiently high intensities and with appropriate interaction lengths, non-linear effects of SPM may be enhanced by other non-linear processes such as cross-phase modulation (XPM), modulation instability (MI), stimulated Raman scattering (SRS), and/or four-wave mixing (FWM). These processes may result in further spectral broadening in excess of 100 nm, producing a supercontinuum radiation output. For example, to produce supercontinuum broadening, the critical length of the tapered optical fiber (i.e. the length of the tapered region) would be long, the laser input radiation power would be high and/or the pulse length would be short.

In Raman scattering, radiation called Stokes (anti-Stokes) radiation with frequencies downshifted (upshifted) from the input laser frequency are generated in the laser radiation. With sufficient laser intensity and interaction length in the medium, the Stokes radiation can grow and deplete the input energy in the case of SRS. The cascade of the SRS processes generates more low frequency radiation. In the presence of both intense input and Stokes radiation, anti-Stokes radiation can be generated during SRS with frequencies up-shifted from the input frequency. The frequency shifts are dependent on the vibrational modes of the medium.

In addition to Raman scattering, additional frequencies can be generated with the four-wave mixing (FWM) process in which multiple radiation fields interact to create a new radiation field in which the total energy is conserved and phase matching of the radiation fields is achieved. Further, the spectral broadening of the radiation by SPM and XPM can cause the spectra of the radiation to widen and merge and form a broad spectrum.

The threshold radiation intensity $P_{th}$ for SRS in an optical fiber with a Raman gain coefficient $g_r$, diameter d, and attenuation coefficient $\alpha$ is approximated by:

$$P_{th} \approx \frac{16\alpha}{C_R} \quad (4)$$

with $$C_R = \frac{g_r}{A_{eff}} = \frac{g_r}{\pi\left(\frac{d}{2}\right)^2} \quad (5)$$

However, with a nominal laser wavelength(s) within the anomalous dispersion region of the tapered fiber 650, the spectral broadening of the laser beam will be dominated by supercontinuum generation in the tapered fiber 650 waist due to the presence of solitons and related nonlinear optical processes.

It should be noted that the spectral broadening achieved by coupling of the laser radiation into a tapered optical fiber may not be symmetrical around the nominal wavelength of the laser radiation. The spectral range obtained through such spectral broadening may be governed by the mathematical equations and/or optical mechanism mentioned above. However, a symmetrical spectral broadening may be achieved using suitable parameter values in some embodiments or by appropriate downstream spectral filtering/selection optics.

The coherence length of the radiation is inversely proportional to its spectral width. Thus, by broadening the spectral width of the radiation from the laser, the coherence length of the radiation may be shortened. For example, a coherence length of less than about 750 microns can be achieved. For example, a coherence length selected from the range of about 400 microns to about 750 microns can be achieved. In an embodiment, a coherence length of less about 0.5 mm can be achieved. A short coherence length is advantageous because it can, for example, reduce the interference effects of spurious or ghost reflections present during, for example, alignment. In various embodiments, the coherence length of the radiation is selected from the range of about 400 μm to about 750 μm. Obviously, the actual coherence length will depend on the nominal wavelength and the coherence length of the input radiation (e.g., radiation in the green wavelength), and the spectral widening achieved as described herein as well as the spectral width selected by the downstream optics for the optical alignment sensor system.

In an embodiment, the laser and the tapered optical fiber as described herein used to broaden the nominal wavelength of the laser may advantageously reduce coherence offset effects in an optical sensor, e.g., an optical sensor for a lithographic application such as an optical sensor of an alignment detector. For example, an alignment sensor may require bright short coherence length radiation in the visible and the broadening as described herein may reduce the coherence effects in such a sensor caused by such bright short coherence length radiation. The coherence offset effects arise from, e.g., cavities between optical elements in the sensor. Such cavities may largely be uncorrectable and so the broadening can compensate therefor. The short coherence length and broadening as described can reduce 15 pm or more of alignment offset arising from such coherence effects.

The spectral width of the radiation source described herein can be reliably and easily modulated by, e.g., modulating one or more parameters of the input radiation. For example, spectral width may be increased by decreasing the pulse width (i.e., increasing the rate of change of intensity), or increasing the intensity of the input radiation or the spectral width may be decreased by increasing the pulse width (i.e., decreasing the rate of change of radiation intensity), or decreasing the intensity of the input radiation. Additionally or alternatively, the spectral width may be increased by increasing the critical length of the tapered optical fiber (i.e., the length of the tapered region) or increasing the electro-optic coefficient of the tapered optical fiber (particularly in the tapered region of the tapered optical fiber), or decreased by decreasing the critical length of the tapered optical fiber (i.e., the length of the tapered region of the tapered optical fiber) or decreasing the electro-optic coefficient of the tapered optical fiber (particularly in the tapered region of the tapered optical fiber).

In an embodiment, the tapered optical fiber 630 is formed by heating and stretching a regular silica-based optical fiber, for example, a standard step-index or a graded index optical fiber having, for example, a cylindrical cross-section. The regular silica based optical fiber may be a single mode fiber, a few-mode fiber, or a multi-mode fiber.

In an embodiment, the tapered optical fiber 630 supports a single optical mode or a plurality of optical modes. In an embodiment, the tapered optical fiber 630 may be made from one or more materials, for example, one or more materials selected from undoped or doped silica, fluorozirconate, fluoroaluminate, a chalcogenide glass, a plastic or any other material having a refractive index that varies dependent on radiation intensity.

Thus, in an embodiment, a broad spectrum and short coherence length can be obtained simultaneously by pumping radiation into a tapered optical fiber to produce radiation by a non-linear process. That is, the radiation is coupled into a tapered optical fiber with a small taper waist where one or more nonlinear optical processes due to the high rate of radiation intensity variation and complex dispersion properties of the tapered optical fiber generate broad spectrum or continuum of radiation on either side of the wavelength of the input radiation in the tapered optical fiber. In particular, in an embodiment, broad spectrum radiation in the visible and/or the near infrared region (e.g., in the 500-900 nm region) is produced using a non-linear process in a tapered optical fiber. In an embodiment, the radiation is produced using the tapered optical fiber and laser radiation with an output wavelength (and having, for example, short—picosecond, or femtosecond—pulse) in the visible or near infrared region. In an embodiment, the generated radiation is a supercontinuum.

In an embodiment, by using input radiation in the visible spectrum or within the spectrum of the output radiation, rather than, e.g., radiation outside the visible or not within the spectrum of the output radiation, the instability or noise in the power spectrum of the output radiation (e.g., a spectrum of visible radiation) can be reduced since such instability or noise tends to increase with the wavelength difference between the output radiation and the input radiation due to the dynamics of the underlying nonlinear optical process responsible for the generation of a supercontinuum. This could improve the performance of a measurement system detector which is designed for use in the output radiation spectrum (e.g., in the visible or 500-900 nm region).

The use of a tapered optical fiber to provide nonlinear optical spectral broadening of pump laser radiation, for example, reduces the cost, enhances the simplicity, improves reliability and/or provides flexibility in the design of the system compared to more complex and/or costly solutions. The use of tapered optical fiber enables a system that is scalable in performance and can satisfy/meet the performance and reliability requirements of a measurement sensor.

As discussed above, in an embodiment, the system can be tailored in terms of design by optimizing one or more parameters of the tapered optical fiber, such as the length and/or cross-sectional size (e.g., diameter) of the taper waist, and/or one or more parameters of the pump laser radiation, such as pump radiation wavelength, average power, pulse duration and/or pulse repetition rate. In an embodiment, the output radiation is within or near the spectral range of an alignment sensor.

As discussed above, in an embodiment, common silica based fiber can be used. In an embodiment, an endcap can be fused onto the input facet of the tapered optical fiber to reduce the optical intensity of the radiation (and thus, e.g., reduce the probability of optical damage and so enhance reliability of the system).

As discussed above, in an embodiment, to, e.g., increase the output power of the system, two linearly polarized lasers in the visible can be combined using a polarization combiner to provide the pump radiation. In an embodiment, multiple pump lasers with different output wavelengths can be combined using one or more dichroic mirrors. By using a plurality of lasers, the lifetime/reliability of the system can be increased by, e.g., enabling pump laser redundancy.

As noted above, in an embodiment, the laser radiation is produced by a pump laser producing radiation with a green wavelength, e.g., by an about 780 nm laser, by a Ti-sapphire laser, or by a frequency doubled erbium laser.

Lasers are widely available. Additionally, the tapered optical fiber can be relatively easily prepared, e.g., by heating and stretching a regular optical fiber. Therefore, using one or more lasers and a tapered optical fiber to provide short coherence length, broad spectral width radiation around a nominal visible wavelength could advantageously result in minimal disruption to existing measurement system setups, while advantageously providing an efficient, reliable and tunable means of broadening the spectral width of the radiation in a measurement apparatus such as ASML's SMASH alignment sensor.

So, in an embodiment, 500-900 nm broad spectral width radiation for a measurement apparatus, such as an alignment sensor, is generated by supercontinuum generation (SCG) in a tapered fiber. In the relatively simple and versatile tapered fiber design, the anomalous dispersion of the tapered fiber, for instance, can be adjusted by manipulating a taper waist dimension in relation to the wavelengths of the laser(s) used. Soliton-based nonlinear optical processes are instrumental in supercontinuum generation and they are facilitated by operating the laser(s) in the anomalous dispersion region of the nonlinear media. Indeed, the group velocity dispersion (GVD) can be made anomalous at a visible wavelength with an appropriate taper waist dimension (e.g., diameter). So, a laser(s) within the spectral region of the sensor of the measurement apparatus can be used to enhance performance (e.g. efficiency, noise, spectral coverage, etc.). And, in an embodiment, more than one laser can be used for better reliability (with redundancy in lasers) and/or performance.

In an embodiment, there is provided a measurement apparatus, comprising: a tapered optical fiber, the tapered optical fiber having an input to receive radiation and having an output to provide spectrally broadened output radiation toward a measurement target, the tapered optical fiber configured to spectrally broaden the radiation received at the input; and a detector system configured to receive a redirected portion of the output radiation from the measurement target.

In an embodiment, the tapered optical fiber comprises an untapered region to receive the radiation at its core and a tapered region to provide the spectrally broadened output radiation, wherein a cross-sectional size of the tapered region is smaller than a cross-sectional size of the core of the untapered region. In an embodiment, the core cross-sectional size of the untapered region and/or a core cross-sectional size of an untapered region of the tapered optical fiber to receive the spectrally broadened output radiation, is up to about 10 μm. In an embodiment, the cross-sectional size of the tapered region is up to about 2.5 μm. In an embodiment, wherein a length of the tapered region is between about 10 cm and about 50 cm. In an embodiment, a first transition region is configured to couple the untapered region and the tapered region, and wherein a length of the first transition region is between about 1 cm and about 5 cm. In an embodiment, a second transition region is configured to couple the tapered region and a further untapered region, and wherein a length of the second transition region is between about 1 cm and about 5 cm. In an embodiment, the tapered optical fiber has a material having a refractive index that varies in dependence on an intensity of radiation incident on it. In an embodiment, the tapered optical fiber supports at least one optical mode. In an embodiment, the received radiation at the input of the tapered optical fiber is generated by a laser with a nominal wavelength in the visible or near-infrared and the output radiation is in the visible or near-infrared. In an embodiment, the laser is a pulsed laser. In an embodiment, the laser is a Ti-sapphire laser, an Alexandrite laser or a praseodymium-based laser. In an embodiment, the laser is a frequency doubled erbium laser or a visible or NIR laser diode. In an embodiment, the received radiation at the input of the tapered optical fiber is a combination of radiation from two or more lasers. In an embodiment, two or more of the lasers are one or more selected from: a Ti-sapphire laser, an Alexandrite laser, a praseodymium-based laser, a frequency doubled erbium laser, a visible laser diode, and/or a near-infrared laser diode. In an embodiment, the apparatus further comprises a control system configured to modulate a parameter of the laser such that the output radiation has a spectral width within the regime between 500 nm and 900 nm. In an embodiment, the parameter is average power, peak power, pulse width, pulse repetition rate, or any combination selected therefrom. In an embodiment, the apparatus further comprises a band-pass filter, at or downstream of an output of the tapered optical fiber, to reduce and/or control the spectral width of the output radiation. In an embodiment, the tapered optical fiber is formed by heating and stretching a step index or a graded index optical fiber. In an embodiment, the detector system is configured to determine alignment of two or more objects responsive to the redirected portion of the output radiation.

In an embodiment, there is provided a method, comprising: spectrally broadening, using a tapered optical fiber, received radiation to generate an output radiation; providing the output radiation onto a measurement target; and receiving a redirected portion of the output radiation from the measurement target at a detector system.

In an embodiment, the tapered optical fiber comprises an untapered region to receive the radiation at its core and a tapered region to provide the spectrally broadened output radiation, wherein a cross-sectional size of the tapered region is smaller than a cross-sectional size of the core of the untapered region. In an embodiment, a core cross-sectional size of the untapered region and/or a core cross-sectional size of an untapered region of the tapered optical fiber to receive the spectrally broadened output radiation, is up to about 10 µm. In an embodiment, the cross-sectional size of the tapered region is up to about 2.5 µm. In an embodiment, a length of the tapered region is between 10 cm and 50 cm. In an embodiment, a first transition region is configured to couple the untapered region and the tapered region, and wherein a length of the first transition region is between about 1 cm and about 5 cm. In an embodiment, a second transition region is configured to couple the tapered region and a further untapered region, and wherein a length of the second transition region is between about 1 cm and about 5 cm. In an embodiment, the tapered optical fiber has a material having a refractive index that varies in dependence on an intensity of radiation incident on it. In an embodiment, the tapered optical fiber supports at least one optical mode. In an embodiment, the received radiation at the input of the tapered optical fiber is generated by a laser with a nominal wavelength in the visible or near-infrared and the output radiation is in the visible or near-infrared. In an embodiment, the laser is a pulsed laser. In an embodiment, the laser is a Ti-sapphire laser, an Alexandrite laser or a praseodymium-based laser.

In an embodiment, the laser is a frequency doubled erbium laser or a visible or NIR laser diode. In an embodiment, the received radiation at the input of the tapered optical fiber is a combination of radiation from two or more lasers. In an embodiment, two or more of the lasers are one or more selected from: a Ti-sapphire laser, an Alexandrite laser, a praseodymium-based laser, a frequency doubled erbium laser, a visible laser diode, and/or a near-infrared laser diode. In an embodiment, the method further comprises modulating a parameter of the laser such that the output radiation has a spectral width within the regime between 500 nm and 900 nm. In an embodiment, the parameter is average power, peak power, pulse width, pulse repetition rate, or any combination selected therefrom. In an embodiment, the method further comprises filtering the output radiation using a band-pass filter, at or downstream of an output of the tapered optical fiber, to reduce and/or control the spectral width of the output radiation. In an embodiment, the tapered optical fiber is formed by heating and stretching a step index or a graded index optical fiber. In an embodiment, the method further comprises determining alignment of two or more objects responsive to the redirected portion of the output radiation.

An embodiment may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including near infrared radiation (e.g., radiation having a wavelength in the range of about 700 nm to about 1400 nm), visible radiation (e.g., radiation having a wavelength in the range of about 390 nm to 700 nm, e.g., about 633 nm or in the range of about 495 nm to about 570 nm, e.g., about 515 nm, about 520 nm, or about 532 nm), ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A measurement apparatus, comprising:
a tapered optical fiber, the tapered optical fiber having an input to receive radiation and having an output to provide spectrally broadened radiation toward a measurement target, the tapered optical fiber configured to spectrally broaden the radiation received at the input and the tapered optical fiber comprising a material having a refractive index that varies in dependence on an intensity of radiation incident on it; and
a detector system configured to receive a redirected portion of the spectrally broadened radiation from the measurement target.

2. The apparatus of claim 1, wherein the tapered optical fiber comprises an untapered region to receive the radiation at its core and a tapered region to provide the spectrally broadened radiation, wherein a cross-sectional size of the tapered region is smaller than a cross-sectional size of the core of the untapered region.

3. The apparatus of claim 2, wherein the core cross-sectional size of the untapered region and/or a core cross-sectional size of an untapered region of the tapered optical fiber to receive the spectrally broadened radiation, is up to about 10 µm.

4. The apparatus of claim 2, wherein the cross-sectional size of the tapered region is up to about 2.5 µm.

5. The apparatus of claim 2, wherein a length of the tapered region is between about 10 cm and about 50 cm.

6. The apparatus of claim 2, wherein a transition region is configured to couple the untapered region and the tapered region, and wherein a length of the transition region is between about 1 cm and about 5 cm.

7. The apparatus of claim 2, wherein a transition region is configured to couple the tapered region and a further untapered region, and wherein a length of the transition region is between about 1 cm and about 5 cm.

8. The apparatus of claim 1, further comprising a plurality of lasers, where at least a first laser of the lasers is configured to provide radiation of a first polarization and at least a second laser of the lasers is configured to provide radiation of a second different polarization and/or at least a first laser of the lasers is configured to provide radiation of a first wavelength and at least a second laser of the lasers is configured to provide radiation of a second different wavelength and wherein the received radiation at the input of the tapered optical fiber is a combination of radiation with the first and second wavelengths and/or first and second polarizations from two or more of the lasers.

9. The apparatus of claim 8, wherein at least one laser of the lasers is one or more selected from: a Ti-sapphire laser, an Alexandrite laser, a praseodymium-based laser, a frequency doubled erbium laser, a visible laser diode, and/or a near-infrared laser diode.

10. The apparatus of claim 1, further comprising a control system configured to modulate a parameter of a laser such that the spectrally broadened radiation has a spectral width within the regime between 500 nm and 900 nm, wherein the parameter is average power, peak power, pulse width, pulse repetition rate, or any combination selected therefrom.

11. The apparatus of claim 1, wherein the detector system is configured to determine alignment of two or more objects responsive to the redirected portion of the spectrally broadened radiation.

12. The apparatus of claim 1, wherein the optical fiber is configured to output spatially coherent radiation with a coherence length of less than or equal to about 750 microns.

13. A method comprising:
spectrally broadening, by a tapered optical fiber, received radiation to generate spectrally broadened radiation, the tapered optical fiber comprising a material having a refractive index that varies in dependence on an intensity of radiation incident on it;
providing the spectrally broadened radiation onto a measurement target; and
receiving a redirected portion of the spectrally broadened radiation from the measurement target at a detector system.

14. The method of claim 13, further comprising providing radiation of a first polarization using at least a first laser of a plurality of lasers and radiation of a second different polarization using at least a second laser of the lasers and/or providing radiation of a first wavelength using at least a first laser of a plurality of lasers and radiation of a second different wavelength using at least a second laser of a plurality of lasers and wherein the received radiation of the tapered optical fiber is a combination of radiation with the first and second wavelengths and/or first and second polarizations from two or more of the lasers.

15. The method of claim 13, comprising using the detector system to determine alignment of two or more objects responsive to the redirected portion of the spectrally broadened radiation.

16. The method of claim 13, wherein the optical fiber is configured to output spatially coherent radiation with a coherence length of less than or equal to about 750 microns.

17. The method of claim 13, further comprising modulating a parameter of a laser such that the spectrally broadened radiation has a spectral width within the regime between 500 nm and 900 nm, wherein the parameter is average power, peak power, pulse width, pulse repetition rate, or any combination selected therefrom.

18. The method of claim 13, wherein the tapered optical fiber comprises an untapered region to receive the radiation at its core and a tapered region to provide the spectrally broadened radiation, wherein a cross-sectional size of the tapered region is smaller than a cross-sectional size of the core of the untapered region.

19. The method of claim 18, wherein the cross-sectional size of the tapered region is up to about 2.5 μm.

20. The method of claim 18, wherein a length of the tapered region is between about 10 cm and about 50 cm.

* * * * *